US008760812B1

(12) United States Patent
Chen et al.

(10) Patent No.: US 8,760,812 B1
(45) Date of Patent: Jun. 24, 2014

(54) DISK DRIVE HEAD GIMBAL ASSEMBLY HAVING A JUMPER IN A FLEXIBLE PRINTED CIRCUIT OVERLAP REGION (71) Applicant: Western Digital Technologies, Inc., Irvine, CA (US)

(72) Inventors: Yih-Jen D. Chen, Fremont, CA (US); Tzong-Shii Pan, San Jose, CA (US); Yanning Liu, San Ramon, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/797,893

(22) Filed: Mar. 12, 2013

Related U.S. Application Data (63) Continuation-in-part of application No. 13/331,313, filed on Dec. 20, 2011, and a continuation-in-part of application No. 13/398,578, filed on Feb. 16, 2012, now Pat. No. 8,295,013.

(51) Int. Cl.
*G11B 5/127* (2006.01)
(52) U.S. Cl.
USPC ...................................................... 360/244.1
(58) Field of Classification Search
USPC .......... 360/244.1, 244.2, 244.5, 244.3, 244.9, 360/245.4, 234.5, 245, 245.3, 245.7, 245.9, 360/234.6, 245.1, 245.6, 264.3
See application file for complete search history.

(56) References Cited

U.S. PATENT DOCUMENTS

| 5,465,186 | A | 11/1995 | Bajorek et al. |
|---|---|---|---|
| 5,861,661 | A | 1/1999 | Tang et al. |
| 5,903,056 | A | 5/1999 | Canning et al. |
| 6,036,813 | A | 3/2000 | Schulz et al. |
| 6,076,256 | A | 6/2000 | Drake et al. |
| 6,228,689 | B1 | 5/2001 | Liu |
| 6,351,352 | B1 | 2/2002 | Khan et al. |
| 6,381,099 | B1 | 4/2002 | Mei |
| 6,382,499 | B1 | 5/2002 | Satoh et al. |
| 6,614,623 | B2 | 9/2003 | Nakamura et al. |
| 6,639,757 | B2 | 10/2003 | Morley et al. |
| 6,656,772 | B2 | 12/2003 | Huang |
| 6,703,566 | B1 | 3/2004 | Shiraishi et al. |
| 6,708,389 | B1 | 3/2004 | Carlson et al. |
| 6,757,137 | B1 | 6/2004 | Mei |
| 6,992,862 | B2 | 1/2006 | Childers et al. |
| 7,075,701 | B2 | 7/2006 | Novotny et al. |
| 7,099,117 | B1 | 8/2006 | Subrahmanyam et al. |
| 7,154,708 | B2 | 12/2006 | Chhabra et al. |
| 7,205,484 | B2 | 4/2007 | Shiraishi et al. |
| 7,245,458 | B2 | 7/2007 | Zhang et al. |
| 7,298,593 | B2 | 11/2007 | Yao et al. |
| 7,359,154 | B2 | 4/2008 | Yao et al. |

(Continued)

*Primary Examiner* — Allen T Cao (57) ABSTRACT

A head stack assembly (HSA) for a disk drive includes a flexible printed circuit (FPC). The FPC includes a plurality of electrically conductive FPC traces, each leading to a respective one of a plurality of FPC bond pads. The HSA also includes a head gimbal assembly (HGA) having a laminated flexure with a plurality of electrically conductive flexure bond pads that are bonded to the plurality of FPC bond pads. The laminated flexure includes a flexure tail having an overlap region that overlaps the FPC. A structural layer of the laminated flexure includes a jumper in the overlap region. The jumper is electrically connected to at least two of the plurality of flexure electrical traces in the flexure conductive layer. The jumper is disposed at least 50 microns from any of the plurality of FPC electrical traces or FPC bond pads.

16 Claims, 6 Drawing Sheets (56) References Cited

U.S. PATENT DOCUMENTS

| | | |
|---|---|---|
| 7,372,669 B2 | 5/2008 | Deguchi et al. |
| 7,375,874 B1 | 5/2008 | Novotny et al. |
| 7,388,733 B2 | 6/2008 | Swanson et al. |
| 7,394,139 B2 | 7/2008 | Park et al. |
| 7,414,814 B1 | 8/2008 | Pan |
| 7,440,236 B1 | 10/2008 | Bennin et al. |
| 7,450,346 B2 | 11/2008 | Arya et al. |
| 7,515,240 B2 | 4/2009 | Lu et al. |
| 7,525,769 B2 | 4/2009 | Yao et al. |
| 7,652,890 B2 | 1/2010 | Ohsawa et al. |
| 7,697,102 B2 | 4/2010 | Hirakata et al. |
| 7,764,467 B2 | 7/2010 | Hanya et al. |
| 7,876,664 B2 | 1/2011 | Tsukagoshi et al. |
| 8,015,692 B1 | 9/2011 | Zhang et al. |
| 8,030,576 B2 | 10/2011 | Kamei et al. |
| 8,111,483 B2 | 2/2012 | Arai |
| 8,120,872 B2 * | 2/2012 | Sekii et al. ................. 360/99.08 |
| 8,295,013 B1 | 10/2012 | Pan et al. |
| 8,295,014 B1 | 10/2012 | Teo et al. |
| 8,320,084 B1 * | 11/2012 | Shum et al. ................. 360/245.9 |
| 8,325,446 B1 | 12/2012 | Liu et al. |
| 8,325,447 B1 | 12/2012 | Pan |
| 8,339,748 B2 | 12/2012 | Shum et al. |
| 8,363,353 B2 * | 1/2013 | Yawata ...................... 360/99.08 |
| 8,416,524 B2 * | 4/2013 | Saichi et al. ............... 360/99.08 |
| 8,467,153 B1 | 6/2013 | Pan et al. |
| 8,477,459 B1 * | 7/2013 | Pan ............................ 360/245.9 |
| 2001/0017749 A1 | 8/2001 | Stefansky |
| 2005/0030670 A1 | 2/2005 | Ando et al. |
| 2005/0243472 A1 | 11/2005 | Kamigama et al. |
| 2006/0098347 A1 | 5/2006 | Yao et al. |
| 2006/0146262 A1 | 7/2006 | Yu et al. |
| 2006/0157869 A1 | 7/2006 | Huang et al. |
| 2007/0246251 A1 | 10/2007 | Shiraishi et al. |
| 2008/0002303 A1 | 1/2008 | Wang et al. |
| 2008/0068757 A1 | 3/2008 | Kamigama et al. |
| 2008/0088975 A1 | 4/2008 | Bennin et al. |
| 2008/0225439 A1 | 9/2008 | Komura |
| 2009/0151994 A1 | 6/2009 | Ohsawa et al. |
| 2009/0207529 A1 * | 8/2009 | Yao ............................ 360/245.9 |
| 2009/0211789 A1 | 8/2009 | Yeates et al. |
| 2009/0253233 A1 | 10/2009 | Chang et al. |
| 2010/0118444 A1 | 5/2010 | Rothenberg et al. |
| 2010/0176827 A1 | 7/2010 | Yamazaki et al. |
| 2010/0188778 A1 | 7/2010 | Castagna |
| 2010/0195474 A1 | 8/2010 | Tsukuda et al. |
| 2011/0122530 A1 * | 5/2011 | Sekii et al. ................. 360/99.08 |
| 2011/0317309 A1 | 12/2011 | Shum et al. |
| 2012/0067626 A1 | 3/2012 | Mizutani |
| 2012/0200957 A1 * | 8/2012 | Yawata ...................... 360/99.08 |
| 2013/0038964 A1 * | 2/2013 | Garbarino et al. ......... 360/99.08 |
| 2013/0050872 A1 * | 2/2013 | Sekii et al. ................. 360/99.08 |

\* cited by examiner

DISK DRIVE HEAD GIMBAL ASSEMBLY HAVING A JUMPER IN A FLEXIBLE PRINTED CIRCUIT OVERLAP REGION

CROSS-REFERENCE TO RELATED APPLICATIONS

This application claims benefit as a continuation-in-part of pending U.S. patent application Ser. No. 13/331,313, filed Dec. 20, 2011, and entitled "Improved suspension tail design for a head gimbal assembly of a hard disk drive," which is hereby incorporated by reference. This application also claims benefit as a continuation-in-part of pending U.S. patent application Ser. No. 13/398,578, filed Feb. 16, 2012, and entitled "Disk drive head stack assembly having a flexible printed circuit with heat transfer limiting features," which is hereby incorporated by reference, and which is itself a continuation-in-part of U.S. patent application Ser. No. 13/164, 936, filed Jun. 21, 2011, and entitled "Disk drive head gimbal assembly having a flexure tail with features to facilitate bonding" (issued as U.S. Pat. No. 8,325,446), which is a continuation-in-part of U.S. patent application Ser. No. 13/078,829, filed Apr. 1, 2011, and entitled "Disk drive head gimbal assembly having a flexure tail with features to facilitate bonding" (issued as U.S. Pat. No. 8,320,084), which is a continuation-in-part of pending U.S. patent application Ser. No. 12/916,237, filed Oct. 29, 2010, and entitled "Disk drive head gimbal assembly having a flexure tail with folded bond pads."

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write. A head that can read may be referred to as a "read head" herein, even if includes other structures and can perform other functions, such as a writer for writing, a heater for heating, a microactuator, etc.

In a modern magnetic hard disk drive device, each read head is a sub-component of a head-gimbal assembly (HGA) that typically includes a laminated flexure to carry the electrical signals to and from the read head. The HGA, in turn, is a sub-component of a head-stack assembly (HSA) that typically includes a plurality of HGAs, an actuator, and a flexible printed circuit (FPC). The plurality of HGAs is attached to various arms of the actuator.

Modern laminated flexures typically include flexure conductive traces that are isolated from a flexure structural layer by a flexure dielectric layer. So that the signals from/to the read head can reach the FPC on the actuator body, each HGA flexure includes a flexure tail that extends away from the read head along a corresponding actuator arm and ultimately attaches to the FPC adjacent the actuator body. That is, the flexure includes flexure traces that extend from adjacent the read head and continue along the flexure tail to flexure electrical connection points adjacent the FPC.

The FPC includes conductive electrical terminals that correspond to the electrical connection points of the flexure tail, and FPC conductive traces that lead from such terminals to a pre-amplifier chip. The FPC conductive traces are typically separated from an FPC stiffener by an FPC dielectric layer. The FPC may also include an FPC cover layer over the FPC conductive traces, the FPC cover layer having a window to allow electrical conduction to the pre-amplifier chip and access to the FPC terminals. To facilitate electrical connection of the flexure conductive traces to the FPC conductive electrical terminals during the HSA manufacturing process, the flexure tails must first be properly positioned relative to the FPC, so that the flexure conductive traces are aligned with the FPC conductive electrical terminals. Then the flexure tails must be held or constrained against the FPC conductive electrical terminals while the aforementioned electrical connections are made (e.g. by ultrasonic bonding, solder jet bonding, or solder bump reflow).

However, recently for some disk drive products, the aforementioned electrical connections may employ a type of anisotropic conductive film (ACF) bonding. An anisotropic conductive film is typically an adhesive doped with conductive beads or cylindrical particles of uniform or similar diameter. As the doped adhesive is compressed and cured, it is heated and squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads. The cured adhesive film may conduct electricity via the contacting beads in a direction normal to the bonded surfaces (though may not necessarily conduct electricity parallel to the bonded surfaces, since the beads may not touch each other laterally—though axially each bead is forced to contact both of the surfaces to be bonded—hence the term "anisotropic").

Maintaining sufficiently uniform temperature and pressure during adhesive curing, such that a single layer of conductive beads in an ACF makes contact with both opposing surfaces to be bonded and curing is acceptably uniform, may be achievable in a high-volume manufacturing environment by pressing against several bond pads simultaneously with a thermode tool that applies acceptably uniform pressure and heat.

However, if the flexure tail includes one or more jumpers (e.g. to enable interleaving common traces for improved electrical characteristics), then a local thickness of the flexure tail at the location of such jumper(s) may interfere with the uniformity of applied pressure and heat from the thermode tool. For example, the jumper may receive an undesirable quantity of the heat and pressure applied by the thermode, potentially at the expense of the desired pressure and heat applied by the thermode to the bond pads.

Moreover, there is a risk that the pressure and heat undesirably applied to the jumper by the thermode tool may cause the jumper structure to undesirably short conductive traces of the abutting FPC, for example by disrupting the integrity of an overcoat layer. Hence, there is a need in the art for improved structures and methods to interconnect the flexure tails to the FPC in a disk drive, with improved uniformity of connection and/or reduced risk of incidental shorting, even where the presence of a jumper near the bond pads is desired.

DESCRIPTION OF THE PREFERRED EMBODIMENTS

Figure 1:
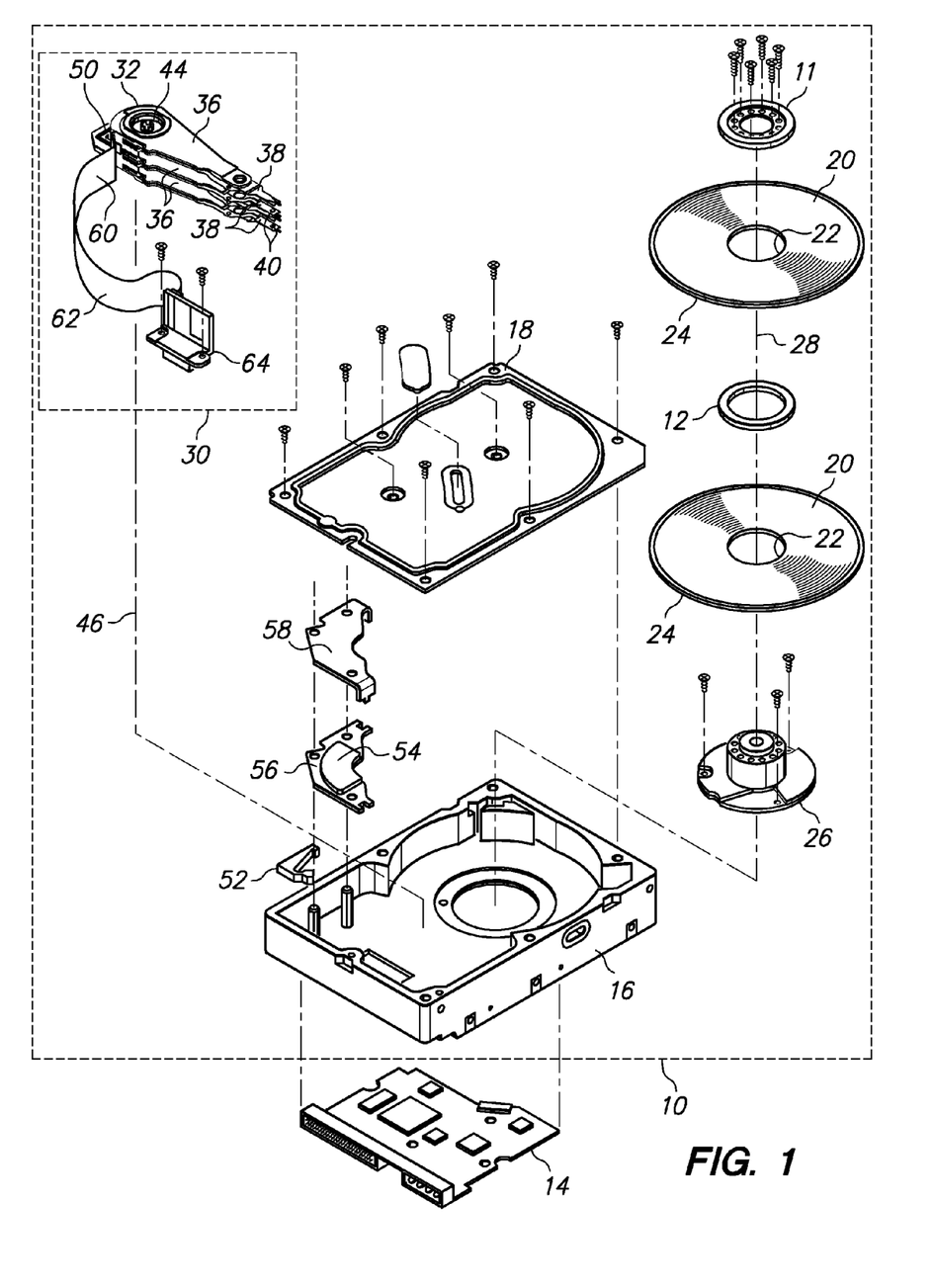
FIG. 1 is an exploded perspective view of a disk drive capable of including an embodiment of the present invention.

FIG. 1 is an exploded perspective view of a disk drive according to an example embodiment of the present invention. The disk drive includes a head disk assembly (HDA) 10 and a printed circuit board assembly (PCBA) 14. The HDA 10 includes a base 16 and cover 18 that together form an enclosure that houses at least one annular magnetic disk 20. Each disk 20 contains a plurality of magnetic tracks for storing data. The tracks are disposed upon opposing first and second disk surfaces of the disk 20 that extend between an inner disk edge 22 (corresponding to the inner diameter) and an outer disk edge 24 (corresponding to the outer diameter) of the disk 20. The head disk assembly 10 further includes a spindle motor 26 for rotating the disk 20 about a disk axis of rotation 28. The spindle motor 26 includes a spindle motor hub that is rotatably attached to the base 16 of the HDA 10. Disks 20 may be stacked and separated with one or more annular disk spacers 12 that are disposed about the hub, all held fixed to the hub by disk clamp 11.

The HDA 10 further includes a head stack assembly (HSA) 30 rotatably attached to the base 16 of HDA 10. The HSA 30 includes an actuator comprising an actuator body 32 and one or more actuator arms 36 extending from the actuator body 32. The actuator body 32 includes a bore 44 and a pivot-bearing cartridge engaged within the bore for facilitating the HSA 30 to rotate relative to HDA 10 about actuator pivot axis 46. One or two head gimbal assemblies (HGA) 38 are attached to a distal end of each actuator arm 36. Each HGA 38 includes a read head (e.g. read head 40) for reading and writing data from and to the disk 20. The HSA 30 further includes a coil 50 through which a controlled electrical current is passed. The coil 50 interacts with one or more magnets 54 that are attached to base 16 via a yoke structure 56, 58 to form a voice coil motor for controllably rotating the HSA 30. HDA 10 includes a latch 52 rotatably mounted on base 16 to prevent undesired rotations of HSA 30.

The PCBA 14 includes a servo control system for generating servo control signals to control the current through the coil 50 and thereby position the HSA 30 relative to tracks disposed upon surfaces of disk 20. The HSA 30 is electrically connected to PCBA 14 via a flexible printed circuit (FPC) 60, which includes a flex cable 62 and a flex cable support bracket 64. The flex cable 62 supplies current to the coil 50 and carries signals between the HSA 30 and the PCBA 14.

In the magnetic hard disk drive of FIG. 1, the read head 40 includes a body called a "slider" that carries a magnetic transducer on its trailing end (not visible given the scale of FIG. 1). The magnetic transducer may include an inductive write element and a magnetoresistive read element. During operation the transducer is separated from the magnetic disk by a very thin hydrodynamic air bearing. As the motor 26 rotates the magnetic disk 20, the hydrodynamic air bearing is formed between an air bearing surface of the slider of read head 40, and a surface of the magnetic disk 20. The thickness of the air bearing at the location of the transducer is commonly referred to as "flying height."

Figure 2:
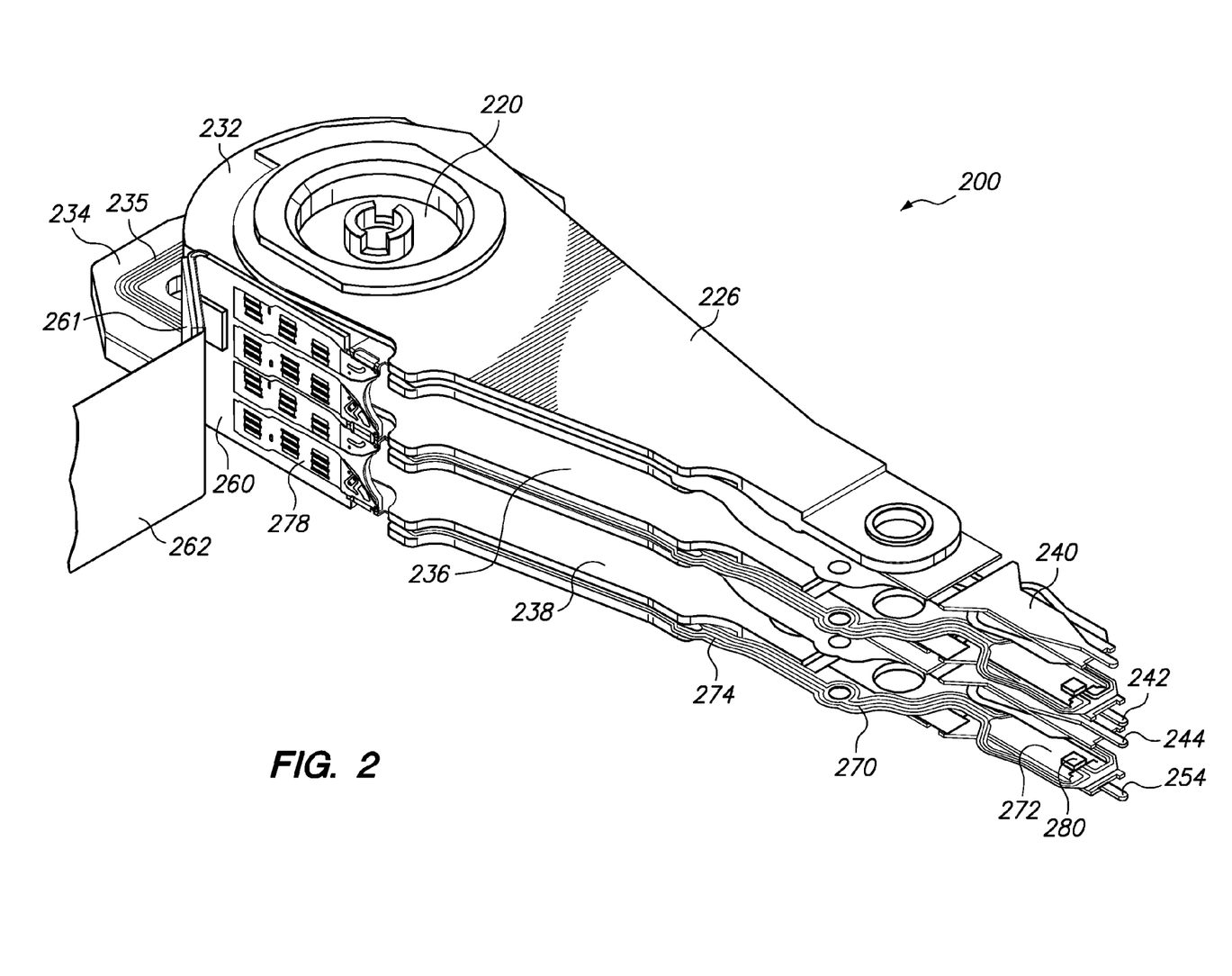
FIG. 2 is a perspective view of a head stack assembly (HSA) according to an embodiment of the present invention.

FIG. 2 is a perspective view of a head stack assembly (HSA) 200 according to an example embodiment of the present invention. The HSA 200 includes an actuator body 232 and a plurality of actuator arms 226, 236, 238 extending from the actuator body 232. The actuator body 232 may comprise aluminum, for example. The actuator body 232 may include a pivot bearing cartridge 220 disposed in the actuator bore, and a coil support 234 that supports a coil 235 and extends from the actuator body 232 in a direction that is generally opposite the actuator arms 226, 236, 238.

In the embodiment of FIG. 2, the HSA 200 also includes a plurality of head gimbal assemblies (HGA) 240, 242, 244, 254, attached to the actuator arms 226, 236, 238. For example, such attachment may be made by swaging. Note that the inner actuator arm 236 includes two HGAs, while each of the outer actuator arms 226, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a read head for reading and/or writing to an adjacent disk surface (e.g. HGA 254 includes head 280). The read head 280 is attached to a tongue portion 272 of a laminated flexure 270. The laminated flexure 270 is part of the HGA 254, and may include a structural layer (e.g. stainless steel), a dielectric layer (e.g. polymide), and a conductive layer into which traces are patterned (e.g. copper). The HSA 200 also includes a flexible printed circuit (FPC) 260 adjacent the actuator body 232, and the FPC 260 includes a flex cable 262 and may include a FPC stiffener 261. The FPC 260 may comprise a laminate that includes two or more conventional dielectric and conductive layer materials (e.g. one or more polymeric materials, copper, etc). The laminated flexure 270 includes a flexure tail intermediate region 274 that is disposed adjacent the supporting actuator arm 238, and a flexure tail terminal region 278 that is electrically connected to bond pads of the FPC 260.

Methods of electrical connection of the flexure tails to the FPC 260 include ultrasonic bonding of gold coatings thereon, solder reflow, solder ball jet (SBJ), and anisotropic conductive film (ACF) bonding, and are preferably but not necessarily automated. To electrically connect and securely attach the flexure tails to the FPC 260, the flexure tails are first aligned with the FPC 260, and then pressed against the FPC 260 (at least temporarily) while electrical connection is established and secure attachment is completed. Maintaining sufficiently uniform pressure and temperature to groups of bond pads may be desirable during this process, and certain example embodiments of the invention described herein may enhance the uniformity of temperature and pressure applied to the bond pads.

Figure 3:
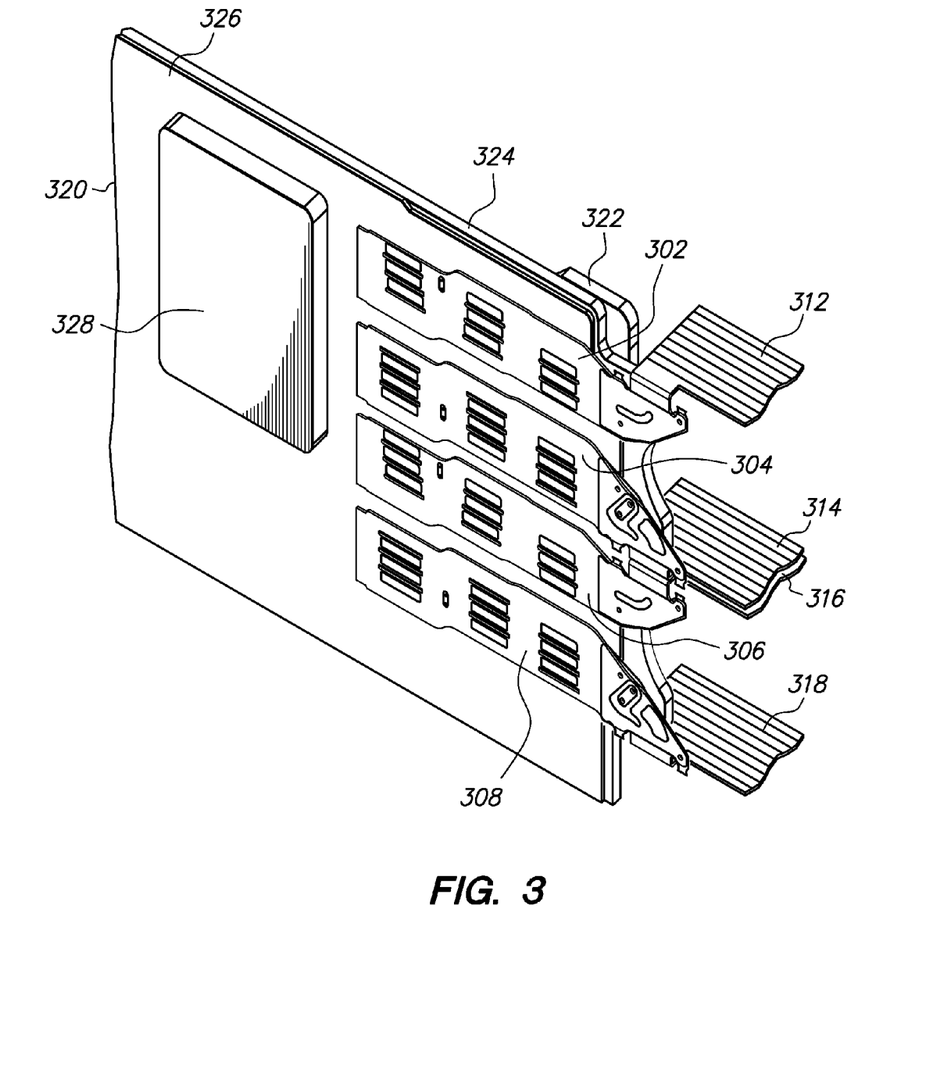
FIG. 3 is a perspective view of a plurality of laminated flexure tail terminal regions attached to a FPC, according to an embodiment of the present invention.

FIG. 3 is a perspective view of a plurality of laminated flexure tail terminal regions 302, 304, 306, 308 attached to a FPC 320, according to an embodiment of the present invention. The FPC 320 optionally includes a FPC stiffener 322, a FPC dielectric layer 324, and FPC conductive traces (not visible in FIG. 3 because the FPC conductive traces are beneath a FPC insulative cover layer 326. The FPC 320 may also include a preamplifier chip 328 in electrical connection with the FPC conductive traces. The FPC stiffener 322 may be metallic; for example, the FPC stiffener 322 may comprise aluminum. The FPC stiffener 322 may be disposed in contact with the actuator body after assembly (e.g. in contact with the actuator body 232 that is shown in FIG. 2).

In the example embodiment of FIG. 3, each of the flexure tails is bent so that each of the flexure tail terminal regions 302, 304, 306, 308 is substantially orthogonal to flexure tail intermediate regions 312, 314, 316, 318, respectively. Each of the flexure tail terminal regions 302, 304, 306, 308 includes a plurality of conductive flexure tail bond pads that are electrically connected to corresponding FPC bond pads of the FPC 320. Although the bond pads are obscured in the view of FIG. 3, examples will be shown and described with reference to subsequent figures herein.

Figure 4:
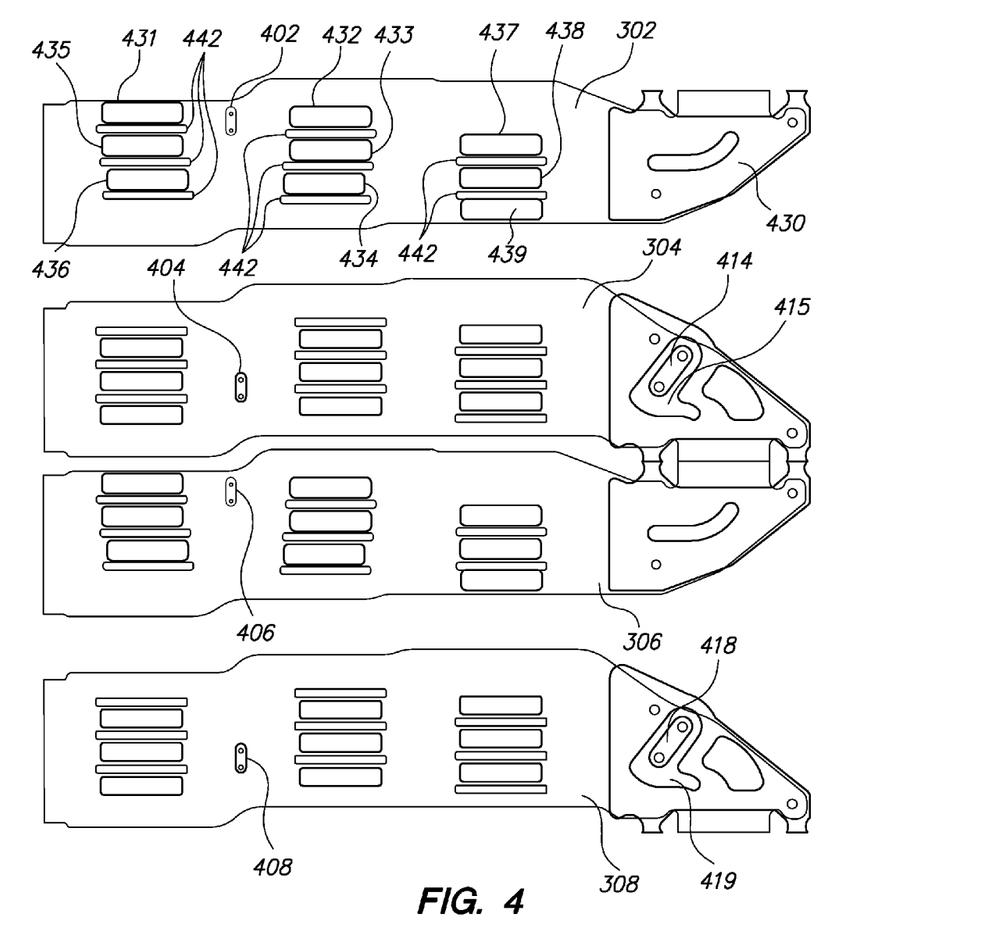
FIG. 4 depicts a plurality of laminated flexure tail terminal regions, according to an embodiment of the present invention.

FIG. 4 more clearly shows the flexure tail terminal regions 302, 304, 306, 308, according to an example embodiment of the present invention. In the embodiment of FIG. 4, the flexure tail terminal regions 302, 304, 306, 308 are arranged as shown in FIG. 3, except without depicting the FPC to which they are attached. In such arrangement, each flexure tail terminal regions 302, 304, 306, 308 is oriented with its flexure structural layer closest to the viewer, so that its flexure structural layer and flexure dielectric layer effectively obscures the view of other flexure layers and features of other flexure layers. Still, all the flexure layers of this embodiment will be shown and described with reference to subsequent FIG. 5.

Still referring to the embodiment of FIG. 4, each of the flexure tail terminal regions 302, 304, 306, 308 includes a plurality of bonding islands in the flexure structural layer. For example, the flexure tail terminal region 302 includes bonding islands 431, 432, 433, 434, 435, 436, 437, 438, and 439 in the flexure structural layer 430. Each of the bonding islands 431, 432, 433, 434, 435, 436, 437, 438, and 439 in the flexure structural layer 430 is aligned with a corresponding flexure bond pad in the flexure conductive layer (not visible in the view of FIG. 4, because the flexure bond pads in the flexure conductive layer are obscured in this view by the bonding islands in the flexure structural layer and by the flexure dielectric layer).

In the embodiment of FIG. 4, each of a plurality of optional slots 442 in the flexure dielectric layer is disposed adjacent to one or more of the bonding islands 431, 432, 433, 434, 435, 436, 437, 438, and 439 in the flexure structural layer 430. In certain embodiments, the slots 442 through the flexure dielectric layer may serve an adhesive control purpose (e.g. to allow a squeeze-out of adhesive resin under pressure during the flexure tail bonding process).

In the embodiment of FIG. 4, each of the flexure tail terminal regions 302, 304, 306, 308 includes a jumper island 402, 404, 406, 408 respectively in the flexure structural layer. Each of the jumper islands 402, 404, 406, 408 is disposed among and between the bonding islands in the flexure structural layer of the corresponding flexure tail terminal region. For example, the jumper island 402 in the flexure structural layer 430 of the flexure tail terminal region 302 is disposed among the bonding islands 431, 432, 433, 434, 435, 436, 437, 438, 439 in the flexure structural layer 430, and is shown in FIG. 4 to be disposed between the bonding islands 431 and 432, and between bonding islands 431 and 433, and between bonding island 432 and 435.

Note that the flexure tail terminal region 304 also includes another jumper island 414 in the flexure structural layer that is not disposed among and between the bonding islands in the flexure structural layer. The jumper island 414 is discontinuous from the rest of the flexure structural layer in the flexure tail terminal region 304, because it is surrounded by an opening 415 through the flexure structural layer, and it is not disposed between any two of the bonding islands of the flexure tail terminal region 304.

Likewise, the flexure tail terminal region 308 also includes additional jumper island 418 in the flexure structural layer that is not disposed among and between the bonding islands in the flexure structural layer. The jumper island 418 is discontinuous from the rest of the flexure structural layer in the flexure tail terminal region 308, because it is surrounded by an opening 419 through the flexure structural layer, and it is not disposed between any two of the bonding islands of the flexure tail terminal region 308. Each of the jumper islands 414 and 418, like each of the jumper islands 402, 404, 406, 408, is supported and positioned by its attachment to the flexure dielectric layer, and perhaps also by conductive vias and traces that are obscured by the flexure dielectric layer in the view of FIG. 4.

Figure 5:
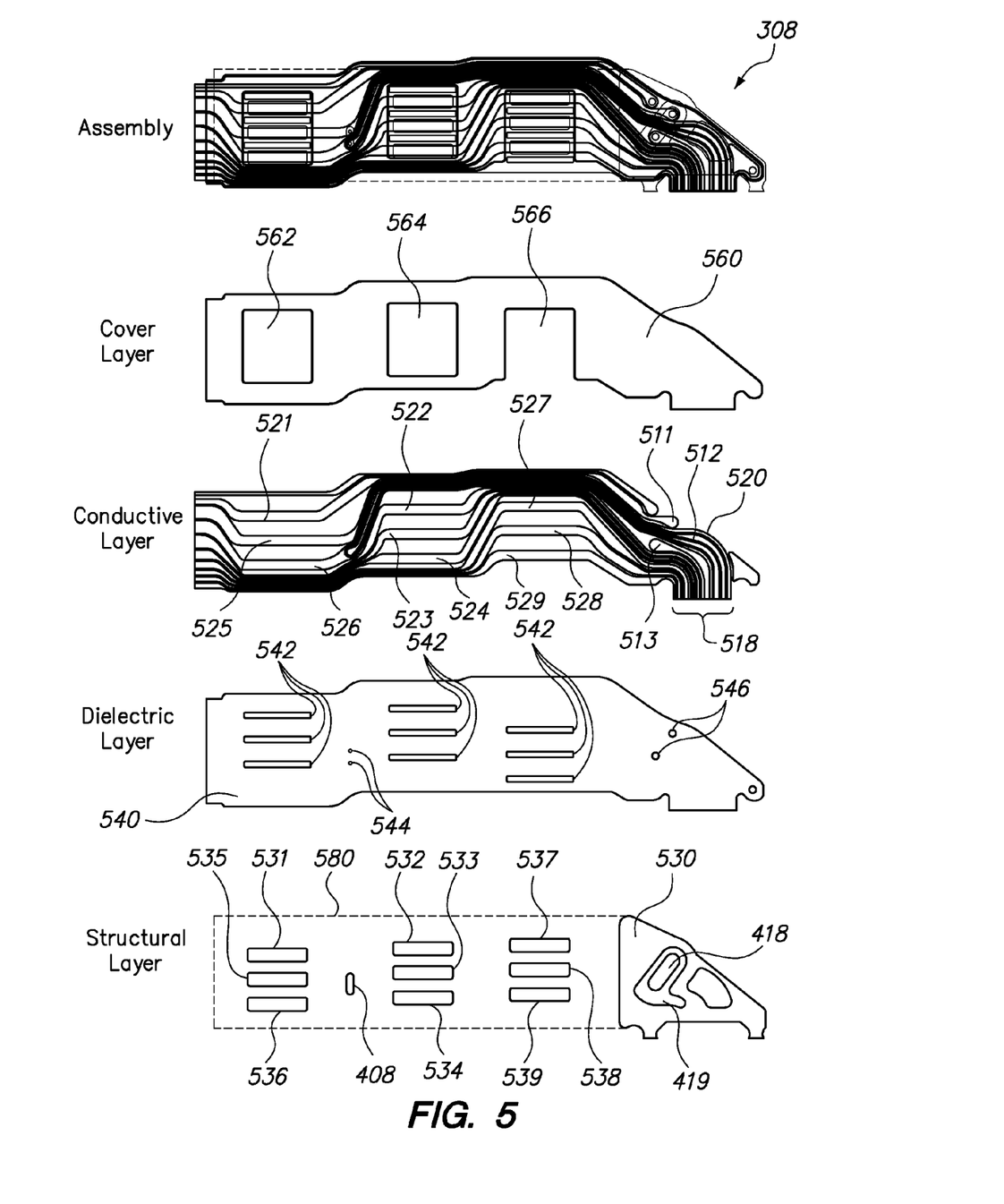
FIG. 5 depicts layers of a laminated flexure tail terminal region, according to an embodiment of the present invention.

FIG. 5 depicts layers of the laminated flexure tail terminal region 308, according to an embodiment of the present invention. In the embodiment of FIG. 5, the flexure tail terminal region 308 comprises a flexure support/structural layer 530, a flexure dielectric layer 540, a flexure conductive layer 520, and an insulative flexure cover layer 560. In certain embodiments, the flexure structural layer 530 comprises stainless steel, the flexure dielectric layer 540 comprises polyimide, and the flexure conductive layer 520 comprises copper, for example, though it is contemplated that in alternative embodiments other materials providing similar function might be used instead.

In the embodiment of FIG. 5, the flexure conductive layer 520 is patterned to define and include a plurality of flexure conductive traces 518. Various flexure conductive traces 518 may connect through to an inductive write element or a magnetoresistive read element of the read head, and/or other subcomponents of the read head or HGA (e.g. microactuator, transducer heater, electronic lapping guide, etc). Each of the plurality of flexure conductive traces 518 includes a widened region that serves as a flexure bond pad to be bonded to the FPC (e.g. FPC 320 shown in FIG. 3), so that the flexure conductive layer 520 includes flexure bond pads 521, 522, 523, 524, 525, 526, 527, 528, 529. In this context, "widened" means wider than the width of a flexure trace 518 in an intermediate region where the flexure tail runs along the arm (i.e. the width of a flexure trace 518 at the right side of FIG. 5). Prior to bonding, each of the plurality of flexure bond pads 521, 522, 523, 524, 525, 526, 527, 528, 529 is preferably aligned with a corresponding one of a plurality of FPC bond pads that are shown and described subsequently with reference to FIG. 6.

In the embodiment of FIG. 5, a plurality of discontinuous bonding islands 531, 532, 533, 534, 535, 536, 537, 538, 539 are defined in the flexure structural layer 530 and are disposed in general alignment with corresponding flexure bond pads 521, 522, 523, 524, 525, 526, 527, 528, 529 in the flexure conductive layer 520. For example, discontinuous island 531 is disposed in general alignment with flexure bond pad 521. In this context, a bonding island in the structural layer 530 is considered to be discontinuous if it does not directly contact the rest of the flexure structural layer 530, even if it is joined by a web or bridge in the flexure dielectric layer 540 and/or the flexure conductive layer 520. In the embodiment of FIG. 5, each of the flexure bond pads 521, 522, 523, 524, 525, 526, 527, 528, 529, along with the corresponding discontinuous bonding islands 531, 532, 533, 534, 535, 536, 537, 538, 539 with which they are aligned, defines a flexure bond pad location.

In the embodiment of FIG. 5, the discontinuous bonding islands 531, 532, 533, 534, 535, 536, 537, 538, 539 in the flexure structural layer 530 preferably increase the thickness of the flexure tail terminal region 308 at the flexure bond pad locations. For example, the thickness of the flexure structural layer 530 may be preferably less than 20 microns, the thickness of the flexure dielectric layer 540 may be preferably less than 15 microns, the thickness of the flexure conductive layer 520 may be preferably less than 15 microns, while a total thickness of the flexure tail terminal region 308 at the flexure bond pad locations is preferably at least 25 microns. Such inequalities may enhance the utility of a non-patterned thermode tool to apply more uniform heat and pressure to the flexure bond pads during bonding.

In the embodiment of FIG. 5, the flexure dielectric layer 540 is disposed between the flexure conductive layer 520 and the flexure structural layer 530, and the flexure dielectric layer 540 electrically insulates the conductive flexure traces 518 of the flexure conductive layer 520 from the flexure structural layer 530. Such electrical insulation may be desired because the flexure structural layer 530 may be electrically conductive (e.g. stainless steel), and so otherwise the flexure structural layer 530 may cause an electrical short between the flexure traces 518 and/or from the flexure traces 518 to ground.

As shown in FIG. 3, the FPC 320, and each of the laminated flexure tail terminal regions 302, 304, 306, 308 has a length and a width that grossly exceeds its thickness. In the present context, the FPC 320 and each of the laminated flexure tail terminal regions 302, 304, 306, 308 are understood to "overlap" if they are observed to overlap as viewed from a direction normal to the length and width, and parallel to the thickness direction. The "overlap" region is defined as the region of overlap (if any) as viewed from that direction. For example, in the embodiment of FIG. 5, the overlap region between the FPC (e.g. FPC 320 of FIG. 3) and the flexure tail terminal region 308 may correspond to the dashed rectangular area 580.

In the embodiment of FIGS. 4 and 5, the flexure structural layer 530 of the flexure tail terminal region 308 includes a first jumper 408 in the overlap region corresponding to the dashed rectangular area 580, and a second jumper 418 that is outside of the overlap region corresponding to the dashed rectangular area 580. Likewise, the flexure tail terminal regions 302, 304, 306 include jumpers 402, 404, 406 within the overlap region, and flexure tail terminal region 304 includes a jumper 414 that may lie outside the overlap region. Each of the jumpers 402, 404, 406, 408, 414, 418 comprises a discontinuous jumper island in the structural layer of the corresponding flexure tail terminal region 302, 304, 306, 308. In this context, a jumper island in the flexure structural layer is considered to be discontinuous if it does not directly contact the rest of the flexure structural layer, even if it is joined by a web or bridge in the flexure dielectric layer and/or the flexure conductive layer.

Now referring again to the embodiment of FIG. 5, the discontinuous jumper island 408 (in the flexure structural layer 530) is electrically connected to at least two of the plurality of flexure electrical traces 518 (in the flexure conductive layer 520) by two conductive vias 544 through the flexure dielectric layer 540. Likewise, the discontinuous jumper island 418 (in the flexure structural layer 530) is electrically connected to at least two of the plurality of flexure electrical traces 518 (in the flexure conductive layer 520) by two conductive vias 546 through the flexure dielectric layer 540. In this way, assuming that the flexure structural layer comprises a conductive metal (e.g. stainless steel), each discontinuous jumper island may serve as an electrical connector between electrical traces in the flexure conductive layer (e.g. to facilitate interleaving such electrical traces).

For example, in the embodiment of FIG. 5, the plurality of flexure electrical traces 518 in the flexure conductive layer 520 includes at least first, second, and third flexure electrical traces 511, 512, 513, with the second flexure electrical trace 512 being disposed between the first and third flexure electrical traces 511, 513, and with the discontinuous jumper island 418 of the flexure structural layer 530 electrically connecting the first and third flexure electrical traces 511, 513, bypassing and not contacting the second flexure electrical trace 512.

In certain embodiments, the need for using jumpers in this way may arise from a desire to interleave conductive traces in a side-by-side trace configuration (e.g. for a laminated flexure that has only one flexure conductive layer). For example, electrical transmission performance may be improved by splitting two of the plurality of flexure conductive traces into four interleaving traces, or alternatively splitting two of the plurality of flexure conductive traces into six or eight interleaving traces, etc. Regardless, the corresponding discontinuous jumper island would be connected to at least two of the plurality of flexure electrical traces. In certain embodiments, the split and interleaved electrical traces are preferably electrically connected to a writer of a corresponding read head.

In the embodiment of FIG. 5, the flexure dielectric layer 540 optionally includes a plurality of through openings 542 (e.g. slots). Each of the plurality of the openings 542 through the flexure dielectric layer 540 may be disposed adjacent, but preferably not overlying, at least one of the plurality of discontinuous bonding islands 531, 532, 533, 534, 535, 536, 537, 538, 539 in the flexure structural layer 530.

In the embodiment of FIG. 5, the insulative flexure cover layer 560 of the laminated flexure tail terminal region 308 optionally overlies the conductive flexure traces 518, except for in certain regions 562, 564, 566 that include the flexure bond pad locations. Specifically, the regions 562, 564, 566 are openings through the flexure cover layer 560, which openings leave the flexure bond pads 521, 522, 523, 524, 525, 526, 527, 528, 529 of the flexure conductive layer 520 exposed in aspect that faces the FPC (e.g. FPC 320 of FIG. 6), to facilitate bonding with corresponding FPC bond pads 621, 622, 623, 624, 625, 626, 627, 628, 629, as described further herein.

Figure 6:
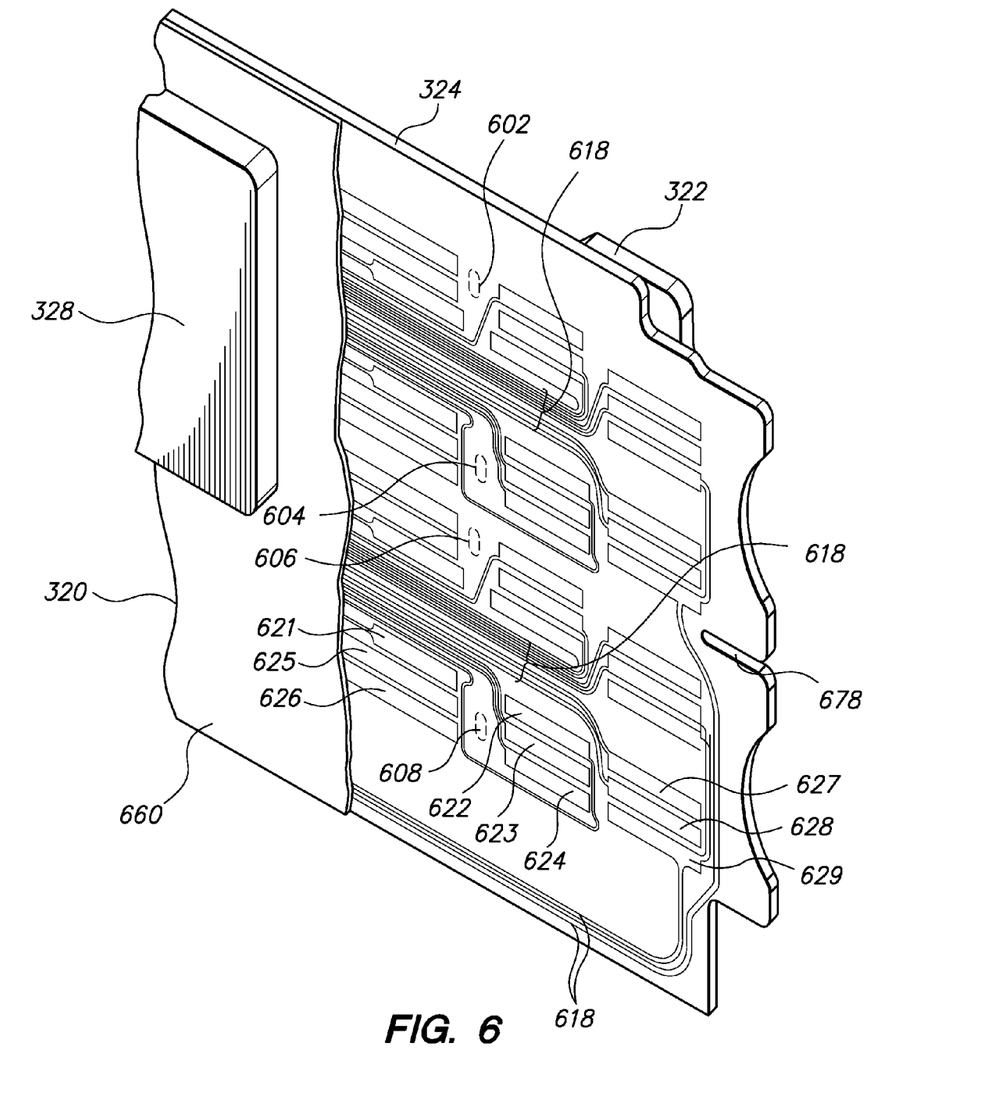
FIG. 6 is a perspective view of a portion of a flexible printed circuit (FPC) according to an embodiment of the present invention, shown with a FPC cover layer partially cut-away to better depict underlying FPC conductive traces.

FIG. 6 is a perspective view of a portion of a flexible printed circuit (FPC) 320 according to an embodiment of the present invention, shown with an optional FPC cover layer 660 partially cut-away to better depict underlying FPC conductive traces 618. In the embodiment of FIG. 6, if not cut-away the optional insulative FPC cover layer 660 is preferably disposed over the FPC traces 618, except that the optional insulative FPC cover layer 660 preferably does not cover the regions where the FPC bond pads (e.g. FPC bond pads 621, 622, 623, 624, 625, 626, 627, 628, 629) are located, and preferably has a window exposing where the pre-amplifier chip 328 is bonded to the FPC 320.

In the embodiment of FIG. 6, each of the plurality of electrically conductive FPC traces 618 of the FPC 320 has a distal portion that terminates at a respective one of a plurality of electrically conductive FPC bond pads. For example the FPC 320 includes electrically conductive FPC bond pads 621, 622, 623, 624, 625, 626, 627, 628, 629. The electrically conductive FPC traces 618 may comprise copper for example, and the FPC bond pads 621, 622, 623, 624, 625, 626, 627, 628, 629 may comprise copper with a gold coating, for example.

In the embodiment of FIG. 6, the electrically conductive FPC bond pads 621, 622, 623, 624, 625, 626, 627, 628, 629 are intended to be aligned with and connected to respective ones of a plurality of flexure bond pads (e.g. flexure bond pads 521, 522, 523, 524, 525, 526, 527, 528, 529 of FIG. 5). In the embodiment of FIG. 6, the electrically conductive FPC traces 618 may connect to a pre-amplifier chip 328 (shown partially cut away in FIG. 6). Intermediate regions of two of the HGA flexure tails (e.g. flexure tail intermediate regions 314, 316 shown in FIG. 3) may pass through the FPC slit 678 to help facilitate their support and alignment.

Now referring again to FIG. 6, the FPC 320 may include a FPC dielectric layer 324 that is disposed between a FPC stiffener 322 and the FPC traces 618, for example to prevent the FPC stiffener 322 from creating an electrical short between the FPC traces 618 if the FPC stiffener 322 comprises a conductive metal. Note that the FPC dielectric layer 324 is not the same layer as the insulative FPC cover layer 660, at least because the insulative FPC cover layer 660 is disposed over the FPC traces 618 rather than between the FPC stiffener 322 and the FPC traces 618.

In certain embodiments, and now referring to FIGS. 4, 5, and 6, each of the flexure bond pads (e.g. flexure bond pads 521, 522, 523, 524, 525, 526, 527, 528, 529 of flexure tail terminal region 308) may be bonded to a corresponding one of the plurality of FPC bond pads (e.g. FPC bond pads 621, 622, 623, 624, 625, 626, 627, 628, 629) by an anisotropic conductive film (ACF). For example, a thermode tool may be brought into contact with a plurality of the discontinuous bonding islands (e.g. discontinuous bonding islands 531, 532, 533, 534, 535, 536, 537, 538, 539 in the flexure structural layer 530), to press the flexure bond pads (e.g. flexure bond pads 521, 522, 523, 524, 525, 526, 527, 528, 529) against the corresponding FPC bond pads (e.g. FPC bond pads 621, 622, 623, 624, 625, 626, 627, 628, 629) for a period.

In certain embodiments, the ACF may comprise an adhesive material that includes electrically conductive beads of substantially similar size. Such electrically conductive beads may be conductive particles of any shape, including spherical or needle shapes, etc. In certain embodiments the adhesive material may be deposited on to the FPC bond pads prior to aligning the flexure bond pads therewith. Alternatively, the adhesive material may be deposited on the flexure bond pads prior to bringing the thermode tool into contact with the discontinuous bonding islands. The force with which the thermode tool presses the flexure bond pads against the FPC bond pads during the period of bonding, may arrange the electrically conductive beads in a monolayer. In this way, each of the plurality of electrically conductive beads in the monolayer may be in electrical contact with both a flexure bond pad and a corresponding FPC bond pad. The thermode tool may also transfer heat through the corresponding discontinuous bonding island during the period of bonding, to raise the temperature of the adhesive material during such period, for example to accelerate curing of the adhesive material.

To help facilitate higher volume manufacturing, the thermode tool may include a flat surface that is substantially larger than any of the plurality of discontinuous bonding islands in the flexure structural layer (e.g. discontinuous bonding islands 531, 532, 533, 534, 535, 536, 537, 538, 539), for example, so that flexure bond pads may be subjected to the applied pressure and heat transfer simultaneously. For example, the thermode tool may have a size corresponding to the dashed rectangle 580 shown in FIG. 5.

The localized flexure tail thickness increases at the location of the flexure bond pads, that result from the presence of the discontinuous bonding islands in the flexure tail terminal region as shown and described previously with reference to FIG. 5, may advantageously allow a large flat thermode tool to provide pressure and heat only to the widened region locations—without a need to first pattern or precisely align the thermode tool. This may advantageously simplify high volume manufacture. That is, in certain embodiments of the present invention, the local thickness variations of the flexure tail due to the discontinuous bonding islands, may act as a self-aligning pattern to augment and assist the thermode tool to selectively apply pressure and heat more to desired flexure bond pad locations than to undesired locations (e.g. locations away from the flexure bond pad locations).

Now referring to FIGS. 4, 5, and 6, such undesired locations include the locations 602, 604, 606, 608, where the discontinuous jumper islands 402, 404, 406, 408 would overlap the FPC 320. However, considering the increased thickness of the flexure tail terminal regions 302, 304, 306, 308 where the discontinuous jumper islands 402, 404, 406, 408 are disposed, the jumper overlap locations 602, 604, 606, 608 are likely to receive substantial undesired heat and pressure from the thermode tool during bonding. Such undesired heat and pressure can be reduced however, by ensuring that the FPC electrical traces (e.g. FPC electrical traces 618) and the FPC bond pads (e.g. FPC bond pads 621, 622, 623, 624, 625, 626, 627, 628, 629) are disposed away from, so as to not overlap, the jumper overlap locations 602, 604, 606, 608.

For example, considering related tolerances and alignment inaccuracies in certain embodiments, the jumper overlap locations 602, 604, 606, 608 may be preferably disposed at least 50 microns from any of the plurality of FPC electrical traces (e.g. FPC electrical traces 618) and at least 50 microns from any of the plurality of electrically conductive FPC bond pads (e.g. FPC bond pads 621, 622, 623, 624, 625, 626, 627, 628, 629). Such a spatial limitation can reduce undesired heat and pressure from the thermode tool during bonding. Such spatial limitation can also reduce the risk that the layers of the flexure tail terminal regions 302, 304, 306, 308 may electrically short with the FPC electrical traces (e.g. FPC electrical traces 618) or the FPC bond pads (e.g. FPC bond pads 621, 622, 623, 624, 625, 626, 627, 628, 629), for example if heat and pressure from the thermode tool during bonding compromises the integrity of the FPC cover layer 660 and/or the flexure cover layer 560.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A disk drive comprising:
   a disk drive base;
   a disk rotably mounted to the disk drive base;
   an actuator rotably mounted to the disk drive base, the actuator including a flexible printed circuit (FPC) that includes a FPC substrate layer and a FPC conductive layer, the FPC conductive layer including a plurality of FPC electrical traces leading to a plurality of electrically conductive FPC bond pads; and
   at least one head gimbal assembly attached to the actuator, the at least one head gimbal assembly comprising
      a read head;
      a load beam; and
      a laminated flexure that comprises a flexure structural layer, a flexure dielectric layer, and a flexure conductive layer that includes a plurality of flexure electrical traces, the flexure dielectric layer being disposed between the flexure structural layer and the flexure conductive layer, the laminate flexure including a tongue portion that connects to the read head, the laminated flexure including a flexure tail having an overlap region that overlaps the FPC;

wherein the flexure tail includes a plurality of flexure bond pads in the overlap region, each of the plurality of flexure bond pads being aligned with a corresponding one of the plurality of FPC bond pads; and wherein the flexure structural layer includes a jumper in the overlap region, the jumper being electrically connected to at least two of the plurality of flexure electrical traces in the flexure conductive layer, the jumper being disposed at least 50 microns from any of the plurality of FPC electrical traces and at least 50 microns from any of the plurality of electrically conductive FPC bond pads.

2. The disk drive of claim 1 wherein the flexure structural layer comprises stainless steel, the flexure dielectric layer comprises polyimide, the flexure conductive layer comprises copper, and the FPC conductive layer comprises copper.

3. The disk drive of claim 1 wherein the jumper comprises a discontinuous island in the flexure structural layer.

4. The disk drive of claim 1 wherein jumper of the flexure structural layer is electrically connected to at least two of the plurality of flexure electrical traces in the flexure conductive layer by at least two conductive vias through the flexure dielectric layer.

5. The disk drive of claim 1 wherein the plurality of flexure electrical traces includes at least first, second, and third flexure electrical traces, the second flexure electrical trace being disposed between the first and third flexure electrical traces in the flexure conductive layer, and wherein the jumper of the flexure structural layer electrically connects the first and third flexure electrical traces, bypassing and not contacting the second flexure electrical trace.

6. The disk drive of claim 5 wherein each of the at least first, second, and third flexure electrical traces is electrically connected to a writer of the read head.

7. The disk drive of claim 1 wherein each of the flexure bond pads is bonded to the corresponding one of the plurality of FPC bond pads by an anisotropic conductive film.

8. The disk drive of claim 7 wherein the anisotropic conductive film comprises an adhesive material that includes a plurality of electrically conductive beads of substantially similar size.

9. The disk drive of claim 8 wherein the plurality of electrically conductive beads is arranged in a monolayer with each of the plurality of electrically conductive beads in electrical contact with one of the plurality of flexure bond pads and the corresponding one of the plurality of FPC bond pads.

10. A head stack assembly (HSA) for a disk drive, the HSA comprising:

an actuator including a flexible printed circuit (FPC) that includes a FPC substrate layer and a FPC conductive layer, the FPC conductive layer including a plurality of FPC electrical traces leading to a plurality of electrically conductive FPC bond pads; and at least one head gimbal assembly attached to the actuator, the at least one head gimbal assembly comprising
a read head;
a load beam; and
a laminated flexure that comprises a flexure structural layer, a flexure dielectric layer, and a flexure conductive layer that includes a plurality of flexure electrical traces, the flexure dielectric layer being disposed between the flexure structural layer and the flexure conductive layer, the laminate flexure including a tongue portion that connects to the read head, the laminated flexure including a flexure tail having an overlap region that overlaps the FPC;

wherein the flexure tail includes a plurality of flexure bond pads in the overlap region, each of the plurality of flexure bond pads being aligned with a corresponding one of the plurality of FPC bond pads; and wherein the flexure structural layer includes a jumper in the overlap region, the jumper being electrically connected to at least two of the plurality of flexure electrical traces in the flexure conductive layer, the jumper being disposed at least 50 microns from any of the plurality of FPC electrical traces and at least 50 microns from any of the plurality of electrically conductive FPC bond pads.

11. The HSA of claim 10 wherein the flexure structural layer comprises stainless steel, the flexure dielectric layer comprises polyimide, the flexure conductive layer comprises copper, and the FPC conductive layer comprises copper.

12. The HSA of claim 10 wherein the jumper comprises a discontinuous island in the flexure structural layer.

13. The HSA of claim 10 wherein jumper is electrically connected to at least two of the plurality of flexure electrical traces in the flexure conductive layer by at least two conductive vias through the flexure dielectric layer.

14. The HSA of claim 10 wherein the plurality of flexure electrical traces includes at least first, second, and third flexure electrical traces, the second flexure electrical trace being disposed between the first and third flexure electrical traces in the flexure conductive layer, and wherein the jumper of the flexure structural layer electrically connects the first and third flexure electrical traces, bypassing and not contacting the second flexure electrical trace.

15. The disk drive of claim 14 wherein each of the at least first, second, and third flexure electrical traces is electrically connected to a writer of the read head.

16. The HSA of claim 10 wherein each of the flexure bond pads is bonded to the corresponding one of the plurality of FPC bond pads by an anisotropic conductive film.

* * * * *